United States Patent [19]

Larkin et al.

[11] 4,243,962

[45] Jan. 6, 1981

[54] DIGITAL TUNING ELEMENT AND METHOD OF MAKING SAME

[75] Inventors: Joseph F. Larkin, Holland; Harold M. Cassidy, Hatboro, both of Pa.; John W. Woodcock, Bellmawr, N.J.; William M. Dunn, Philadelphia, Pa.

[73] Assignee: TRW Inc., Cleveland, Ohio

[21] Appl. No.: 897,420

[22] Filed: Apr. 18, 1978

[51] Int. Cl.³ .............................. H03J 5/06; H03J 5/08
[52] U.S. Cl. .................................. 334/7; 340/347 P; 29/458; 455/170; 455/183
[58] Field of Search ....................... 334/7, 15; 325/464, 325/452; 340/347 P; 29/458

[56] References Cited

U.S. PATENT DOCUMENTS

| | | | |
|---|---|---|---|
| 3,170,155 | 2/1965 | Smith et al. | 340/347 P |
| 3,286,251 | 11/1966 | Byun et al. | 340/347 P |
| 3,569,839 | 3/1971 | Dyer | 325/464 |
| 3,845,393 | 10/1974 | Basset | 325/464 |
| 4,015,253 | 3/1977 | Goldstein | 340/347 P |
| 4,025,914 | 5/1977 | Akita | 340/347 P |

FOREIGN PATENT DOCUMENTS

2315797 1/1977 France ......................... 334/15

Primary Examiner—Alfred E. Smith
Assistant Examiner—Thomas P. O'Hare
Attorney, Agent, or Firm—Jacob Trachtman

[57] ABSTRACT

A digital tuning element and method of making same for an electronic tuning means for an automobile radio which has a drive means for positioning said element, detecting means providing an electrical output signal related to the position of said tuning element, and means receiving the output signal for controlling a tuning circuit. The tuning element is a body which is angularly positionable and includes a coding means on its surface, with the detecting means sensing the coding means for providing binary coded output signals over a plurality of output channels to a receiving means for controlling a tuning circuit.

34 Claims, 14 Drawing Figures

DIGITAL TUNING ELEMENT AND METHOD OF MAKING SAME

The invention relates to a digital tuning element for an electronic tuning means and the method of making same and more particularly to a digital tuning element for an electronic tuning means for automobile radios utilizing binary control signals.

In the past radio apparatuses, particularly automobile radios have been tuned by moving powdered iron cores in and out of coils or inductors to change the resonant frequency of the tuned circuits provided by the coils with capacitors connected across them. This method of tuning is known as permeability tuning. Such tuners have also been provided with a manual tuning knob and a plurality of push buttons which can be set by the operator to selected stations for instant recall.

Although the use of such manual tuning knob and push buttons provided by such tuners are desirable, the size and weight of the traditional automobile radios are a disadvantage in view of the need to make automobiles smaller and lighter, and the need to decrease the space required in the instrument panel. There is also a desire to use newer technologies, such as digital frequency displays, rather than dials and pointers, and to obtain accurate tuning of radio stations provided by the use of digital techniques.

It is, therefore, an object of the invention to provide a new and improved digital tuning element and method of making same for radios which provides the advantages of push button and manual tuning, while reducing the size and weight of a tuning device which must be mounted in the instrument panel of an automobile.

Another object of the invention is to provide a new and improved digital tuning element for radios which reduces the space required for a tuning means and provides a digital frequency display.

Another object of the invention is to provide a new and improved digital tuning element for automobile radios which while reducing the space required in the instrument panel for a tuning means allows a portion of the radio to be positioned in another location for remote control.

Another object of the invention is to provide a new and improved digital tuning element which provides high accuracy in the tuning of desired station frequencies both manually and by presettable push buttons.

Another object of the invention is to provide a new and improved electronic tuning element and method of making the same for automobile radios which is easily manufactured and is low in cost.

The above objects as well as many other objects of the invention are achieved by providing a digital tuning element for an electronic tuning means which is positioned either manually by a tuning knob or by the actuation of a selected one of the plurality of preset push buttons. The digital tuning element has a coding means which is sensed by a detecting means for providing binary coded output signals relating to the position of the tuning element. In the embodiments described, the tuning element is a body having the coding means about its cylindrical surface. The sensed code is delivered by the detecting means over a plurality of channels to a receiving means which may be positioned at a remote location. The receiving means includes a phase locked loop frequency synthesizer which receives the series of binary coded signals from the detecting means and synthesizes a predetermined frequency which is utilized for selecting the desired signal to be received by the radio. The binary coded signals from the detecting means are also utilized for driving a digital frequency display which may be positioned on the automobile instrument panel for easy visibility by the operator. In this manner, the driver may tune the radio in the familiar way, either manually or by push button, without taking his eyes off the road, while allowing accurate electronic tuning as well as digital station frequency display.

The foregoing and other objects of the invention will become more apparent as the following detailed description is read in conjunction with the drawing, in which.

Like numerals designate like parts throughout the several views.

Refer to FIGS. 1 to 4 which illustrate an electronic tuning means 10 embodying the invention. The tuning means 10 is provided with a substantially rectangular housing 12 providing front and rear vertical walls 14, 16, left and right vertical side walls 18 and 20, and top and bottom horizontal walls 22 and 24. The tuning means 10 is provided with a manual tuning knob 26 and a plurality of push buttons 28 extending from the front wall of the housing 12. The push button mechanism of the tuning means 10 allows each push button to be preset to a desired station frequency and may be a structure similar to the low profile tuner described in U.S. Pat. No. 3,943,779. The actuation of a push button 28 results in the lateral shifting of a tuning bar 30 to a position which corresponds to the selected station. Upon the actuation of one of the push buttons, a camming bar 32 is also shifted to the right and then returned to its original position with the release of the push button. Such action is also described in said Pat. No. 3,943,779.

The right end of the tuning bar 30 is secured with a transversely extending leg 34 of an L-shaped bar 36, which has its other leg 38 extending to the right and in spaced parallel relation to the front wall 14 of the housing 12. The upper surface of the leg 38 of the member 36 is provided with a rack gear 40 which engages a pinion gear 42 (see FIG. 2). The pinion gear 42 is fixed with a hollow shaft 44 which is rotatably mounted on a fixed horizontal rod 46. The horizontal rod 46 extends perpendicular to and has its ends 48 and 50 secured with the front and rear walls 14 and 16 within the right end portion of the housing 12.

Figure 1:
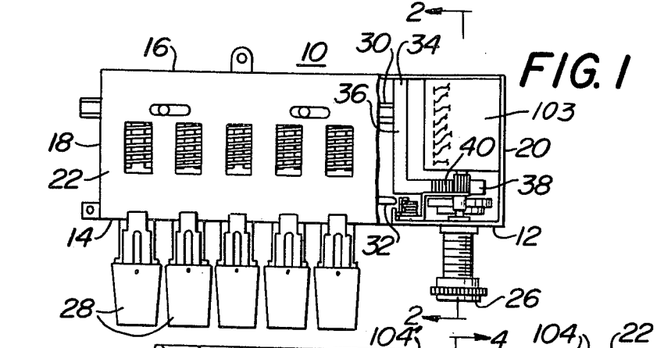
FIG. 1 is a top plan view of an electronic tuning means with a portion of the top wall of the housing broken away to show the tuning element drive means.
Figure 2:
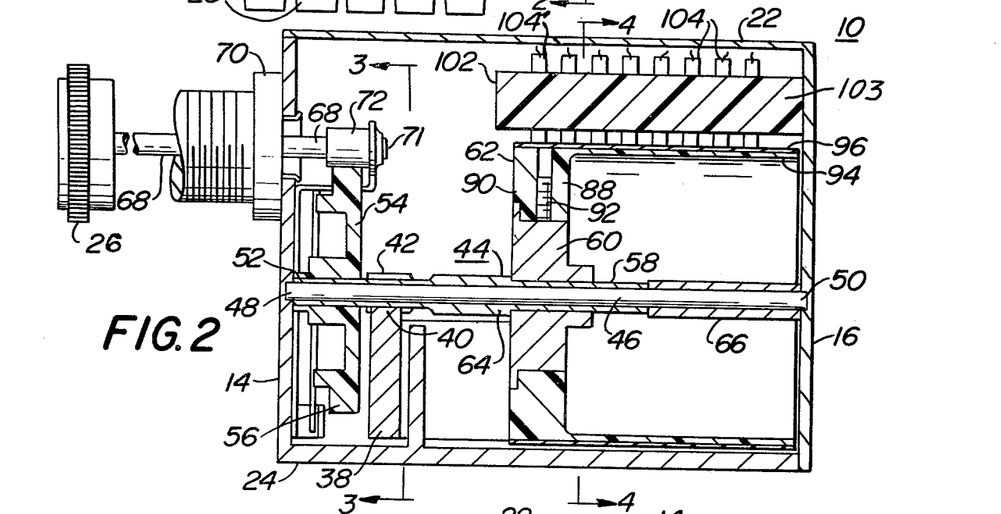
FIGS. 2, 3 and 4 are enlarged sectional views taken on the lines 2—2, 3—3, and 4—4 of FIGS. 1 and 2.
Figure 3:
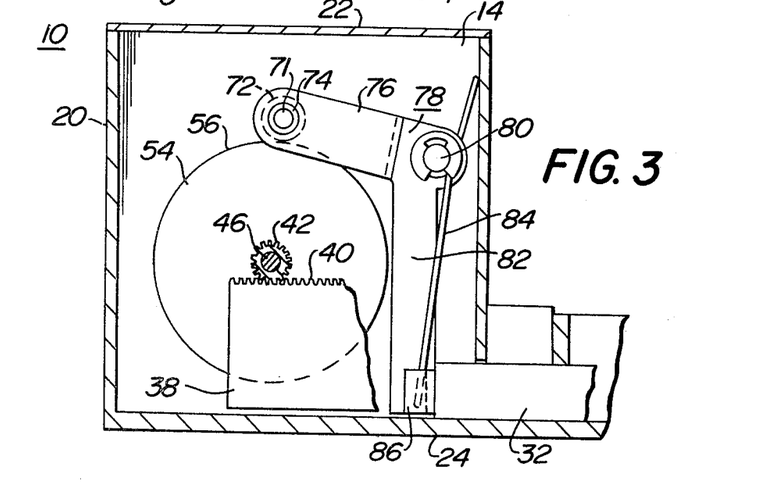

Referring to FIG. 2, the left end 52 of the rotatable shaft 44 extends to the inside surface of the front wall 14 and has secured with it for rotation an enlarged drive wheel 54 providing an outer cylindrical contact surface 56. The other end 58 of the rotatable shaft 44 has secured with it the hub 60 of a tuning element 62 which abuts the shoulder formed by the enlarged central portions of the shaft 44. A cylindrical spacer 66 is received about the right end of the fixed rod 46 between the end 58 of the shaft 44 and the inside surface of the rear wall 16 of the housing 12, for accurately positioning the tuning element 62 and providing a desired clearance between it and the surface of the rear wall 16.

The manual tuning knob 26 is secured with a shaft 68 which is made of a resilient flexible material and is supported for rotation by housing 70 secured with the front wall 14. The shaft 68 extends through the wall 14 into the housing 12 and has secured about its end 71 a small manual actuating wheel 72. The wheel 72 normally frictionally engages the peripheral surface 56 of the drive wheel 54. The end 71 of the shaft 68 is also received through an opening 74 in the end of the substantially horizontally extending arm 76 of a crank 78 which pivots in a vertical plane which is parallel to the front wall 14 about a pin 80 which extends horizontally from the front wall 14. As seen from FIG. 3, a second arm 82 of the crank 78 extends vertically downward and is biased in the counter clockwise direction by a spring 84. The spring 84 is retained about the pin 80 and has one of its ends received within a retainer formed at the bottom 86 of the crank arm 82. The arm 76 of the crank 78, normally urges the end 71 of the shaft 68 in the downward direction for maintaining a good frictional contact between the actuating wheel 72 and the drive wheel 54. However upon the actuation of a push button 28, the end of the cam bar 32 moves to the left (FIG. 3) and engages the lower end 86 of the arm 82 rotating the crank 72, in the clockwise direction. This exerts an upward force on the end 71 of the rod 68, lifting it and the actuating wheel 72, so that the actuating wheel 72 disengages the drive wheel 54. At the same time, the continued movement of a push button 28 results in the positioning of the tuning bar 30 and the corresponding movement of the rack 40. This rotates the pinion gear 42 and the shaft 44. However, since the actuating wheel 72 is disengaged from the drive wheel 54 the shaft 44 and its tuning element 62 easily move to a preset angular position without transmitting rotary movement to the manual tuning knob 26.

In this manner the tuning element 62 which rotates with the shaft 44 may be angularly positioned about the rod 46, either by manual rotation of the knob 26, or by the selective actuation of the push buttons 28 which have been preset to provide predetermined angular dispositions of the tuning element 62 corresponding to desired radio station frequencies.

Figure 4:
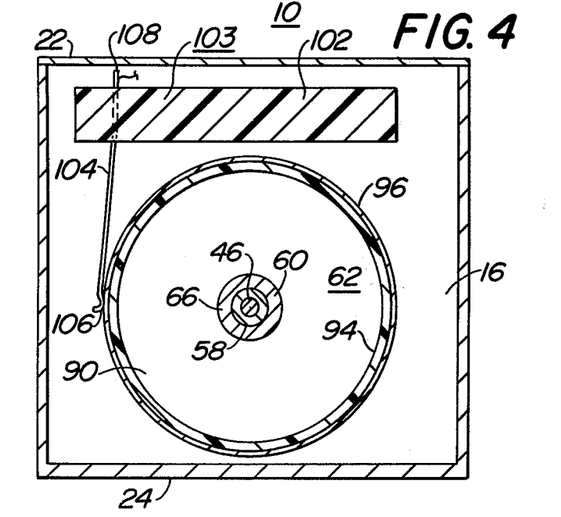

Refer to FIGS. 2 and 4 for a description in greater detail of the tuning element 62. The tuning element 62 is a cylindrical body which may be provided as illustrated by the hub 60, and a portion 88 which may be made of a plastic material having an end section 90 which may be secured with the hub 60, as for example by set screws 92. The plastic portion 88 also has a cylindrical wall portion 94 extending from its end section 90, which is coaxial with the axis of the stationary shaft 46. A coding means 96 is received around the cylindrical outer surface of the wall 94 of the tuning element 62. The coding means 96 may comprise a strip 98 of non-conductive material with a metallic copper or conductive coating 100 on one side illustrated by the shaded portion of FIG. 5, to form a pattern of conductive and non-conductive areas. The conductive and non-conductive areas are formed into longitudinal regions providing parallel spaced tracks for providing parallel coded binary information which will be explained in greater detail. The tuning element 62 with the illustrated coding means 96 about its periphery, provides eight tracks which are numbered 1 to 8. The track number 1 is positioned proximate to the rear wall 16 with the tracks having numbers which increase progressively as they are positioned to the left as seen in FIGS. 2 and 5.

A contactor block 102 of a signal detecting means 103 has one end secured with the inside surface of the rear wall 16 and extends horizontally above and over the outer cylindrical surface of the tuning element 62. A plurality of conductive contact arms 104 are retained in spaced alignment by the block 102, so that the arms extend downwardly with their contact ends 106 in horizontal alignment electrically engaging the coding means 96 at an intermediate region proximate to the horizontal diameter of its cylindrical section as shown in FIG. 4. A contact arm 104 is provided for each of the eight tracks of the coding means 96 and contacts either a conductive or non-conductive area along its circular track depending upon the angular positioning of the tuning element 62. By reference to the pattern of the coding means 96 shown in FIG. 5, it is seen that each of the contact arms 104 will either engage or be disengaged from a conductive area depending upon the angular position of the element 62, except for the left end contact arm 104' (FIG. 2) engaging the circular track 8, which is always in contact with a conductive area. The left end contact arm 104' for the purpose of the embodiment illustrated, may be connected to ground potential or to a positive or negative voltage potential, and each of the other contact arms will be connected to the ground or such other potential when it engages a conductive area of the coding means 96. Thus, the contact arms 104 of the tracks 1 to 7 inclusive, will be connected or disconnected from the potential provided by the contact arm 104' of track 8. The contact arms 104, thus, provide the detecting means 103 with a plurality of digital output signals or channels which are binary encoded and depend upon the angular position of the tuning element 62.

Figure 5:
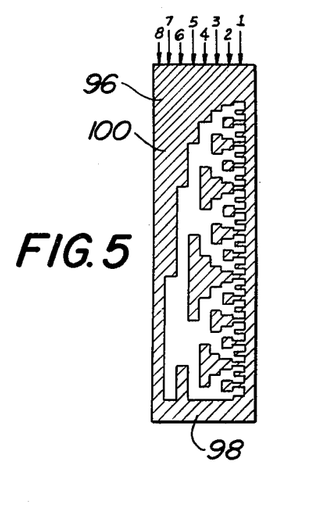
FIG. 5 is a plan view illustrating the coding means prior to being received about the cylindrical surface of a tuning element of the device.

From the configuration or pattern of the coding means 96 of FIG. 5, it is also noted that the binary coded signals provided by the contact arms 104, change with each rotation of the tuning element 62 through a predetermined incremental angular displacement. With continuous angular displacement of the tuning element 62, the coding means 96 provides a series of coded output signals in which one coded signal differs from the next by the change of the binary signal in only one of the plurality of output channels provided by the detecting means. Such changes are provided by what is known as a Gray binary code which is described in "Gray-To Binary Converter Handles Least Significant Bit First," by Gilbert David Beinhocker, in Modern Digital Circuits, Magraw-Hill, 1964, pages 208 to 210. The limiting of successive changes in the binary code in this manner, prevents the delivery of incorrect binary output signals which could be caused by misalignment between the contact arms and the coding means during change from one binary coded output signal to the next.

In the operation of the electronic tuning means 10, the binary coded output signals of the detector means 103 correspond to the radio frequencies of the amplitude modulation (AM) band and/or of the frequency modulation (FM) band. The following Table illustrates such correspondence for the series of coded Gray binary signals provided by the tuning element 62, which is shown in abridged form.

TABLE

| Series Decimal No. | Binary Gray Code Track | | | | | | | AM Frequency (KHz) | FM Frequency (MHz) |
|---|---|---|---|---|---|---|---|---|---|
| | 7 | 6 | 5 | 4 | 3 | 2 | 1 | | |
| 0 | 0 | 0 | 0 | 0 | 0 | 0 | 0 | 540 | 87.3 |
| 1 | 0 | 0 | 0 | 0 | 0 | 0 | 1 | 550 | 87.5 |
| 2 | 0 | 0 | 0 | 0 | 0 | 1 | 1 | 560 | 87.7 |
| 3 | 0 | 0 | 0 | 0 | 0 | 1 | 0 | 570 | 87.9 |
| 4 | 0 | 0 | 0 | 0 | 1 | 1 | 0 | 580 | 88.1 |
| 5 | 0 | 0 | 0 | 0 | 1 | 1 | 1 | 590 | 88.3 |
| 6 | 0 | 0 | 0 | 0 | 1 | 0 | 1 | 600 | 88.5 |
| 7 | 0 | 0 | 0 | 0 | 1 | 0 | 0 | 610 | 88.7 |
| 8 | 0 | 0 | 0 | 1 | 1 | 0 | 0 | 620 | 88.9 |
| 9 | 0 | 0 | 0 | 1 | 1 | 0 | 1 | 630 | 89.1 |
| 10 | 0 | 0 | 0 | 1 | 1 | 1 | 1 | 640 | 89.3 |
| * | * | * | * | * | * | * | * | * | * |
| 20 | 0 | 0 | 1 | 1 | 1 | 1 | 0 | 740 | 91.3 |
| * | * | * | * | * | * | * | * | * | * |
| 30 | 0 | 0 | 1 | 0 | 0 | 0 | 1 | 840 | 93.3 |
| * | * | * | * | * | * | * | * | * | * |
| 40 | 0 | 1 | 1 | 1 | 1 | 0 | 0 | 940 | 95.3 |
| * | * | * | * | * | * | * | * | * | * |
| 50 | 0 | 1 | 0 | 1 | 0 | 1 | 1 | 1040 | 97.3 |
| * | * | * | * | * | * | * | * | * | * |
| 60 | 0 | 1 | 0 | 0 | 0 | 1 | 0 | 1140 | 99.3 |
| * | * | * | * | * | * | * | * | * | * |
| 70 | 1 | 1 | 0 | 0 | 1 | 0 | 1 | 1240 | 101.3 |
| * | * | * | * | * | * | * | * | * | * |
| 80 | 1 | 1 | 1 | 1 | 0 | 0 | 0 | 1340 | 103.3 |
| * | * | * | * | * | * | * | * | * | * |
| 90 | 1 | 1 | 1 | 0 | 1 | 1 | 1 | 1440 | 105.3 |
| * | * | * | * | * | * | * | * | * | * |
| 100 | 1 | 0 | 1 | 0 | 1 | 1 | 0 | 1540 | 107.3 |
| * | * | * | * | * | * | * | * | * | * |
| 106 | 1 | 0 | 1 | 1 | 1 | 1 | 1 | 1600 | 108.5 |

The AM radio stations in the United States are allocated transmitting frequencies which are 10K Hz apart starting at 550 KHz and going up to 1600 KHz. This provides a total of 106 channels. Therefore, 106 different binary code combinations are required to cover the entire AM broadcast band. Similarly, there are 99 FM channels spaced 200 KHz apart from 88.1 MHz to 107.9 MHz. Since the seven channels of binary bits of the detector allows 128 different code combinations, it is sufficient to provide a different coded output signal for each station which is to be tuned by an AM-FM radio. In the above Table, only selected portions of the binary Gray code corresponding to the AM and FM station frequencies are shown for illustrating the form of the Gray code and the correspondence between the code and the AM-FM station frequencies. It is noted that the least significant signal or bit of the Gray code is presented in track 1 while the most significant binary signal or bit is provided in the seventh track, and the AM and FM frequencies are given in the customary decimal form. In considering the first eleven binary Gray codes having series decimal numbers 0 to 10 of the Table, it is noted that each "1" indicates that the contacting arm of a particular track engages a non-conductive area, while each "0" indicates that the arm engages a conductive area. Of course, coding and detector means 96 and 103 may provide "0" output signals for "1" output signals, as desired. In either case, however, it is noted that when the code changes from one output signal to the next with the rotation of the tuning element 62, the output signal changes only in one channel in accordance with the Gray binary code.

The top ends of the contact arms 104 project through the top of block 102 to form a series of output terminals 108 for delivering respective signals for the seven output channels of the binary code utilized. The output signals which are delivered over respective output lines to a receiving means 105 (FIG. 6) are direct current signals, the output signal levels remaining unchanged as long as the tuning element is maintained at a particular angular position. Only the rotation of the tuning element 62 results in the change of output signals with each incremental movement sufficient to cause transition from one binary code to the next. Each output signal in the series of output signals produced represents a change to the next station frequencies depending upon the directions of rotation of the tuning element 62. Thus, if the station transmitting frequencies represented by the coded output signals are decreasing with the rotation in one direction, the rotation of the tuning element in the other direction will result in output signals representing stations with increasing frequencies. Since the output codes represent assigned station frequencies, the transition from one station frequency to the next occurs instantaneously with the change of binary code, and intermediate or unassigned frequencies are not represented. Such electronic digital tuning, thus, prevents tuning between station frequencies, or mistuning of the type which is possible and usual with the permeability or analogue type of tuners.

Figure 6:
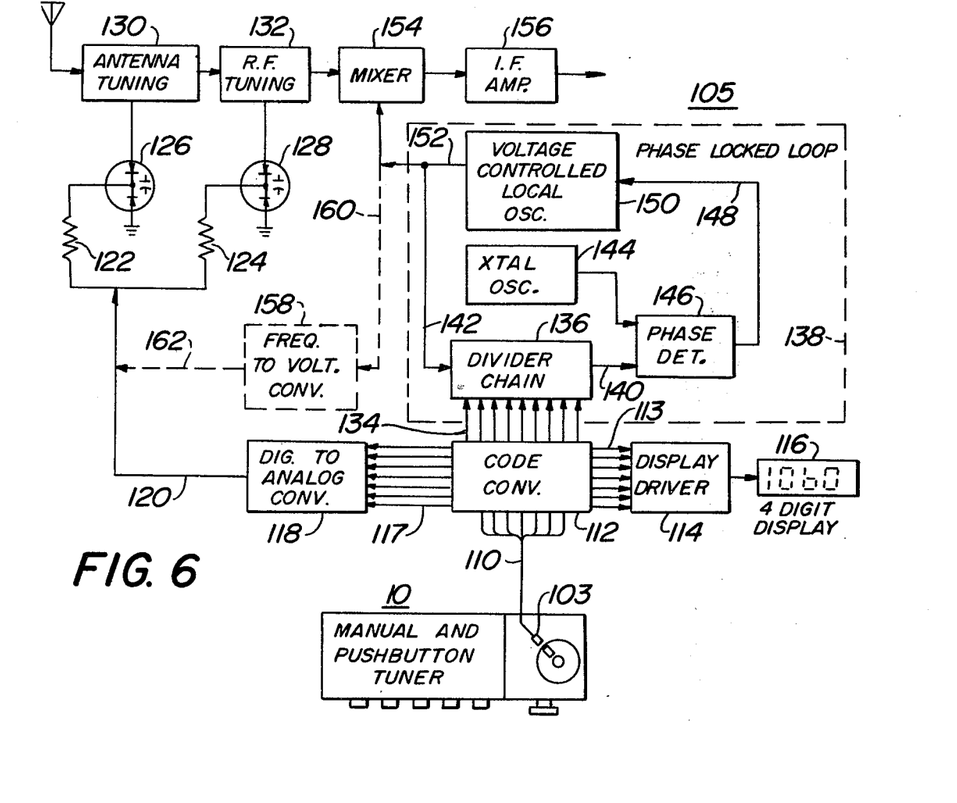
FIG. 6 is a block diagram illustrating a tuning means embodied in a radio receiver.

Refer to FIG. 6 which is a block diagram illustrating the electronic tuning means 10 embodied in a radio receiver 105. The binary coded output signals from the electronic tuning means 10 are delivered over the plurality of output lines 110 from the detector 103 to a code converter 112. The code converter 112 which may convert the Gray binary code to conventional binary code, delivers an output signal over lines 113 to a display driver 114 which energizes a four digit LED display 116 providing a readout of the selected cr tuned station frequency. Such converters and drivers utilizing read only memories (ROM's) are well known and may be addressed by the binary signals from the tuning means 10.

Signals from the code converter 112 may also be delivered over a plurality of output lines 117 to a digital to analogue converter 118. The converter 118 provides an output signal over line 120 having a voltage amplitude related to the digital input signal. This signal is delivered through isolation resistors 122 and 124 to varactor diodes 126, 128. The varactor diodes 126, 128 are respectively utilized for tuning the antenna circuit 130 and the radio frequency (RF) circuit 132 of the receiving means 105.

The code converter 112 also provides signals over a plurality of digital signal output lines 134 to a divider chain 136 of a phase locked loop circuit 138 of the receiving means 105. The phase locked loop circuits 138 of this type are known as phase locked loop frequency synthesizers and are available from Motorola Semiconductors part numbers MC145104, 106, 107, 109, 112, and from RCA as COS/MOS40—Channel Frequency Synthesizers Developmental Type TA10336. The divider chain 136 produces an output signal on its line 140 which has a frequency which is a sub-multiple of the frequency of the input signal received over the line 142. The reduction in frequency provided by the divider chain 136 is determined by the station frequency selected, as represented by the binary output signals of the tuning means 10. The frequency of the output signal on line 140 is compared in a phase detector 146 with the frequency of a signal received from a crystal oscillator 144. Corrective error signals are provided by the phase detector 146 over its output line 148 to a voltage controlled local oscillator 150 when the frequencies of the input signal differ. The local oscillator 150 delivers an output signal on line 152 which is returned over line 142 to the divider chain 136. This signal is also delivered to a mixer circuit 154 which receives radio signals from the RF circuit 132 and delivers an output intermediate frequency (IF) signal for the selected station to the IF amplifier 156 for providing the audio signal in the usual manner. Thus, the phase locked loop circuit 138 synthesizes the frequency of the output signal of its local oscillator 150 to tune the receiver under control of the code converter 112 which is responsive to the position of the tuning element 62 of the tuning means 10.

As an alternative means for tuning the circuits 130 and 132, the output signal from the voltage controlled oscillator 150 may be delivered to a frequency to voltage converter 158 as illustrated by dashed lines 160. The output signal from the converter 158, is delivered to the varactors 126 and 128 over the line 162 instead of the output signal from the digital to analogue converter 118. This similarly results in tuning the antenna and RF circuits 130 and 132 for the desired station frequencies.

With the receiving means 105 operating on the amplitude modulation AM frequency band, frequencies in the range between 540 and 1600 KHz are tuned, and as seen from the Table, the binary Gray code signals delivered to the code converter 112 provides control signals to the phase locked loop 138, so that the local oscillator 150 delivers signals to the mixer 154 with the frequencies required to produce the intermediate (IF) frequency, which by convention is 262 KHz. At the same time the AM selected frequency is indicated by the LED display 116. When the receiver 105 is operated on the frequency modulation FM band, the binary Gray code signals delivered by the electronic means 10 correspond to respective FM station frequencies, and the code converter 112 provides output signals to a phase locked loop circuit 138 which provides local oscillator signals to the mixer 154 which will produce an intermediate frequency for the FM band, which is conventionally 10.7 MHz. At the same time the code converter 112, also provide output signals for displaying the tuned FM station frequency. It is thus noted, that the same electronic tuning means 10, may be utilized for selectively tuning over either the AM or FM frequency band, since each Gray binary code represents both an AM and FM station frequency. However, if such use is to be made, a signal is provided to the code converter 112 for determining whether the AM frequency or FM frequency band has been selected. This allows the appropriate output signals to be delivered over the respective output lines to required phase locked loop circuits 138 for providing the selected tuning operation for the receiving means 105.

Figure 7:
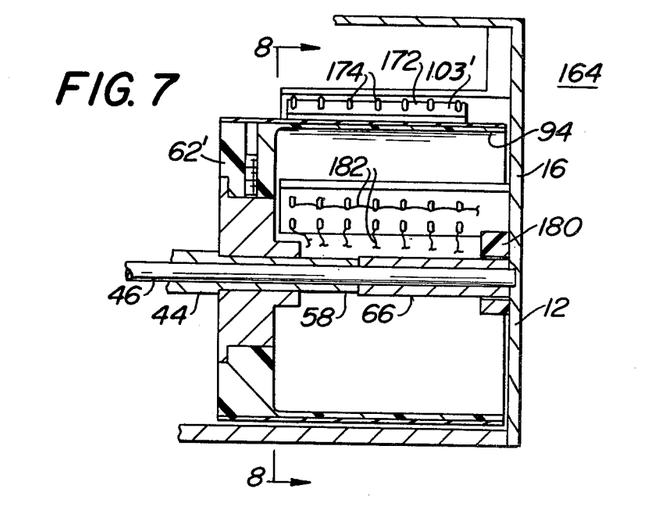
FIG. 7 is a sectional view with portions broken away similar to the view of FIG. 2, illustrating a modified form of the tuning means.
Figure 8:
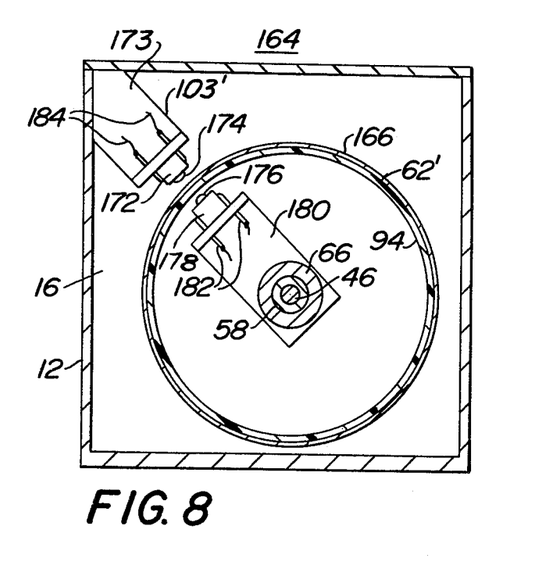
FIG. 8 is a sectional view taken on the line 8—8 of FIG. 7.
Figure 9:
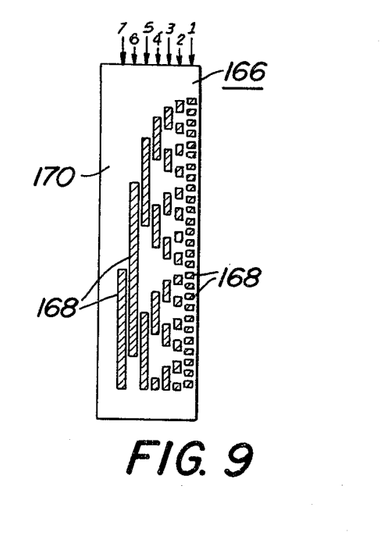
FIG. 9 is a plan view of a coding means used in connection with the form of the device shown in FIG. 7.

FIGS. 7 to 9 illustrate an electronic tuning means 164 which is a modified form of the tuning means 10. The means is similar to the means 10, except for the form of the tuning element 62' and detecting means 103' which will be described in detail.

The tuning element 62' has its cylindrical portion 94 made of a translucent or light transmitting material such as clear plastic. A coding means 166 shown in FIG. 9, is received about the outer cylindrical surface of the tuning element 62' in a manner similar to that of the coding means 96 utilized in the device 10. The coding means 166 however is provided with areas 168 which transmit light and are surrounded by other areas 170 which do not transmit light therethrough. The light transmitting areas 168 are also arranged in regions to form plurality of tracks 1 to 7 inclusive. The detecting means 103' includes a mounting block 172 attached by a bracket 173 to the back wall 16 of the housing 12. The block 172 has mounted thereon, a plurality of aligned light detecting element 174 which may be light detecting transistors or such other suitable devices. A detecting element 174 is provided for each of the 7 tracks of the coding means 166 and is positioned above and proximate to its respective track. A plurality of light emitting elements 176 are mounted in a block 178 and supported by a bracket 180 attached to the wall 16 and extending into the central hollow portion of the tuning element 62'. Seven light emitting elements 176 which may be light emitting diodes, are positioned by the block 178 to be directly opposite to a corresponding light detecting element 174, and are on opposite sides of the coding means 166. Electrical energization is provided to the light emitting elements 176 by appropriate conductor leads 182.

In operation, the light detecting elements 174 of the detector means 103' will produce output signals over their respective output lines 184 when they receive light which is transmitted through the cylinder wall 94 and the coding means 166. Depending upon the rotational position of the tuning element 62', the coding means 166 provides output signals on respective lines 184 of light detecting transistors 174 responsive to whether a light transmitting or non-transmitting area is positioned between the respective light transmitting and detecting elements 176, 174. By this arrangement, the tuning element 62' of the tuning means 164 provides output signals over the conductors 184, representing the Gray binary code, in a manner similar to that of the electronic tuning means 10. The tuning means 164, also has the advantage in eliminating physical contact of contactor arms with the coding means, and the wear and misalignment which may result with use. The output signals provided by the detector 103' are also utilized in the same manner as described in connection with the tuning means 10 for achieving the objects and advantages of the invention.

The FIGS. 10 to 14 illustrate a digital tuning element 186 of the invention which is a modification of the tuning element 62'. The tuning element 186 may be utilized in an electronic tuning means 164' (FIG. 14) which is similar to the means 164. In one form, output signals are produced by the transmission of light through the wall of the tuning element 186 in a manner previously described, and in another form by the reflection of light from the wall of the tuning element 186.

Figures 10, 11, 12, 13:
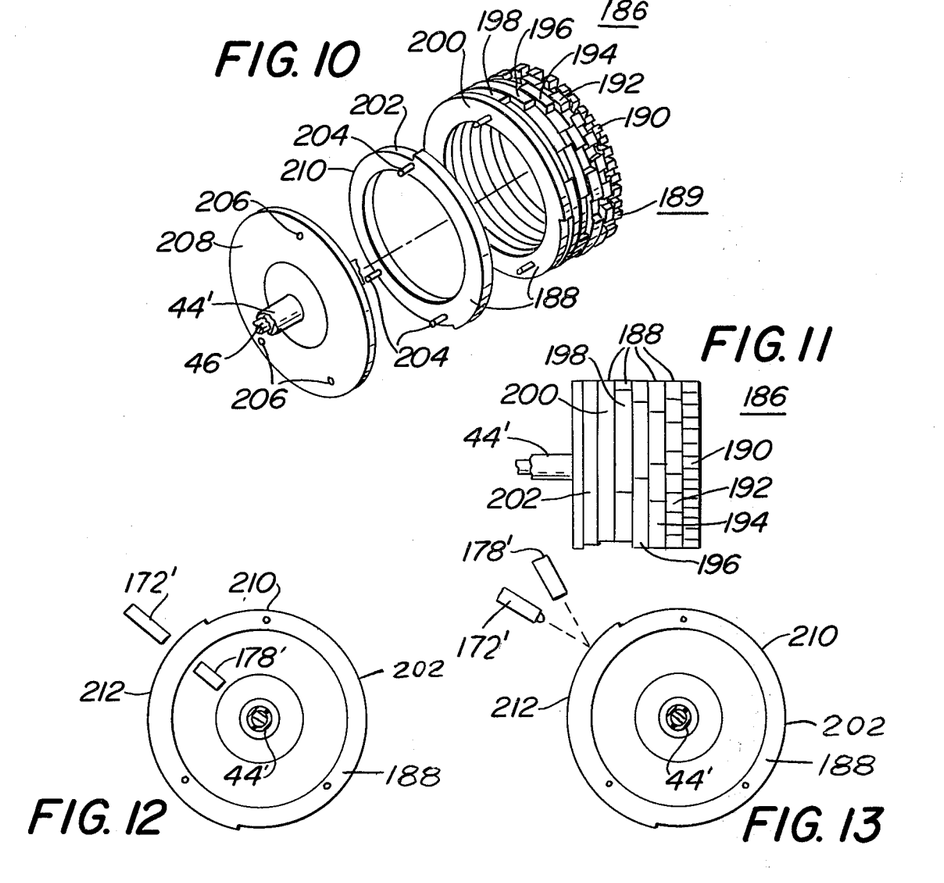
FIG. 10 is an exploded perspective view of an improved modified form of tuning element of the invention.
FIG. 11 is a side elevational view of the tuning element of FIG. 10.
FIGS. 12 and 13 are diagrammatic views of a section of the tuning element of FIG. 10 illustrating different means for sensing the code provided thereon.

The tuning element 186 is comprised of a plurality of ring segments 188, which segments may be made by casting, and have differently contoured or notched peripheral configurations or patterns 190 or 202. The patterns 190 to 202 constitute a coding means 189, providing seven binary digits of the Gray code for the tracks 1 to 7. As seen from FIG. 10 and as illustrated in FIGS. 12 and 13, each segment 188 has a depressed area 210 and a raised area 212 along its track. The depressed and raised areas 210, 212, are respectively on the surfaces of first and second coaxial right circular cylinders, the radius of the first cylinder being less than the radius of the second cylinder. The representations of binary "1" and "0" are provided by the depressed and raised areas as will be explained in greater detail in connection with the method of providing the coding means 189 of tuning element 186.

Each of the ring segments 188 has three axially extending alignment pins 204 which are spaced unevenly from each other. The pins 204 of the right end ring segment 188 which provides track 1, are received into matching openings of its adjacent ring segment 188, thus, fixing the relationship between the contoured patterns 190 and 192 of the respective ring segments 188 providing tracks 1 and 2. Each of the ring segments 188 is similarly aligned and then permanently secured with the next adjacent ring segment 188 as by cementing to form the body of the tuning element 186. The last left end ring segment 188 with the pattern 202 of track 7, has its pins received into the matching openings 206 of a vertical end plate 208 of the tuning element 186. The end plate 208 is provided as its center with a hollow shaft 44' for mounting on rod 46, as illustrated in the sectional view of the tuning means 164' of FIG. 14, in a manner similar to that described in connection with the tuning element 62' of the tuning means 164.

The ring sections 188 of the tuning element 186 may be made of transparent plastic, such as low cost polystrene. After each of the ring segments 188 is assembled in the manner described, the element 186 may be painted or otherwise colored to prevent light from coming through the recessed areas 210 of the tracks. This can be done by the first painting the outer surface of the ring segments 188, then grinding, sanding and/or polishing the raised areas 212 to allow light to pass therethrough. This procedure may be modified, by painting only the outer most or raised areas 212, and leaving the recessed areas 210 transparent for light transmission. The use of the latter method, with the prefabrication of the ring segments, and their assembly by aligned stacking, is highly suitable for the mass production of the tuning element 186 and coding means 189 at a low cost.

Figure 14:
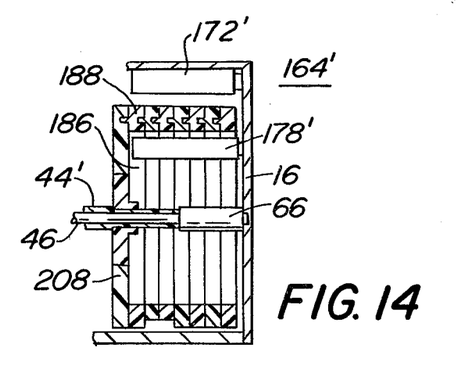
FIG. 14 is a section view of a tuning means similar to the view of FIG. 7 and illustrating the tuning element and detecting means shown in FIG. 12.

FIG. 12 diagrammatically illustrates the manner in which the block 178' of light emitting elements for each track may be positioned within the cylindrical cavity of the element 186, with light detecting means 172' providing a detector for each track positioned oppositely and outside of the tuning element 186 for receiving light transmitted through ring segments 188, the figure particularly illustrating the segment 188 with the pattern 202 of track 7. Receipt of light by a detector of the detecting means 172' depends upon whether a light emitting element of the means 178' is opposite a light transmitting or non-transmitting area 210, 212. The effect of the patterns 192-202 is to produce a particular Gray binary code signal as a function of the position of the tuning element 186 as already described. FIG. 14 is a sectional view illustrating tuning means 164' with the digital tuning element 186 and coding means 189 positioned between the light emitting and detecting means 178' and 172'.

The tuning element 186 may be made in the form in which light is reflected from the tracks of its coding means 189 as diagrammatically illustrated in FIG. 13 for ring segment 202 of track 7. The ring segments 188 may be vacuum plated to provide a "mirror" finish on the entire outer surface, after which the mirror finish is removed from the raised areas 112 to provide the binary coding means 189. Another method is to vacuum plate a "mirror" finish on the entire outer surface of the ring segments 188, and then apply a coating, such as paint, to the entire outer surface and remove or wipe off the coating or paint from the outer most raised areas 212, to expose the "mirror" finish on the raised areas 212 along. The surfaces of the ring segments 188 may be coated by an offset printing process.

Another way of producing the ring segments 188 is to the mold the segments 188 from a black material to provide non-reflective surfaces, vacuum plate the entire outer surfaces of the segments 188, and then remove the plating from the raised portions 212, as by grinding or sanding, to expose the black surfaces, while leaving the depressed areas 210 with reflective surfaces. Alternatively, the mirror surfaces may also be removed from the depressed areas 210 by an etchant after a protective coating is applied to the raised areas 212.

The tuning element 186 produced by the method providing the mirror surfaces on the raised or depressed areas 212, 210, may be utilized as diagrammatically illustrated FIG. 13. For such use, the light emitting and detecting means 178' and 172' are both positioned outside of the segments 188 and respectively direct emitted light to and detect light reflected from the tracks 1 to 7 for producing the coded output signals.

From the embodiments disclosed, the invention provides a digital tuning element and method of making same for an electronic tuning means utilizing the familar manual tuning knob and push buttons while incorporating digital techniques allowing the radio to be tuned accurately and providing a frequency read-out in digital form. The digital tuning element provides an electronic tuning means which is also compact and of reduced size and weight when compared with the present automobile radios. The binary coded output signals of the electronic tuning means are direct current (d.c.) signals rather than high frequency signals of the customary receivers. This allows use of longer output lines without signal deterioration so that the remaining portion of the receiver can be conveniently placed at a remote locaton away from the instrument panel. The digital tuning element allow utilization by the electronic tuning means of digital techniques for repeatedly tuning the radio receiver with high accuracy by manual or push button use. The disclosed digital tuning elements and the methods of making same also have the advantages of being adaptable to mass production techniques and of being capable of being made a low cost.

Although only a few represrentive embodiments of the invention disclosed herein have been described in detail, it will be obvious to those skilled in the art, many modifications or variations thereof accomplishing the foregoing objects and realizing many or all of the advantages but which do not depart essentially from the spirit of the invention.

What is claimed is:

1. In an electronic tuning device responsive to a continuously positionable tuning element which is sensed by a detecting means to provide a plurality of binary coded output signals, a digital tuning element comprising a plurality of individual interconnected disc shaped segments providing a body, each segment of said body having a track encoded with respective binary information for being sensed by a detecting means, said segments being cylindrical sections each having a respectively contoured periphery having different light modulating properties for providing said encoded binary information, said plurality of segments being secured together in a predetermined arrangement coordinating the binary information of one track with the binary information of the other tracks.

2. The means of claim 1 in which each of said segments is provided with indexing means for aligning said segments with each other in a predetermined configuration for coordinating the binary information provided by said tracks.

3. The means of claim 2 in which the indexing means comprises a plurality of pins extending from said segments, and mating openings in said segments for receiving pins from adjacent segments.

4. The means of claim 2 including an end portion secured with an end segment having a central shaft for mounting said body for rotation thereabout.

5. The means of claim 1 in which the peripheries of said segments have depressed and raised areas for providing said encoded binary information.

6. The means of claim 5 in which the depressed and raised areas of said segments conform respectively with the surfaces of first and second coaxial right circular cylinders with the radius of the first cylinder being smaller than the radius of the second cylinder.

7. The means of claim 6 in which each of said segments has an enlarged central opening providing a ring configuration and a cylinder wall, and the walls of said segments have light transmitting properties for encoding said binary information.

8. The means of claim 7 in which the walls of the segments allow light transmission through the raised areas while the depressed areas are coated to prevent light transmission therethrough for providing said encoded binary information.

9. The means of claim 7 in which the walls of the segments allow light transmission through the depressed areas while the raised areas are coated to prevent light transmission therethrough for providing said encoded binary information.

10. The means of claim 6 in which the areas of the raised areas of said segments are light reflective while the depressed areas are non-reflective for providing said encoded binary information.

11. The means of claim 6 in which the depressed areas of said segments are light reflective while the raised areas are non-reflective for providing said encoded binary information.

12. The means of claims 6, 7, 8 or 9 in which each of said segments has indexing means aligning said segments with each other in a predetermined arrangement and coordinating the binary information provided by the tracks, and including an end portion secured with an end segment and having a central shaft along the cylindrical axis of said body for mounting said body for rotation thereabout.

13. A method of making a digital element for an electronic tuning device, with a body having binary information encoded in a plurality of tracks comprising the steps of:

forming a plurality of individual segments which are cylindrical sections each having a contoured periphery having light modulating properties for providing a track with respective encoded binary information, and constructing a body by assembling and securing together the sections in a predetermined order with the sections angularly aligned with each other to provide a predetermined configuration and coordination between the respective encoded binary information of the tracks of said sections.

14. The method of claim 13 in which the cylindrical sections have indexing pins and mating openings, and the sections are assembled and secured together by inserting the indexing pins of one of said sections into the mating opening of the next section during the step of assembling the sections in said predetermined order.

15. The method of claim 14 in which said segments are aligned and secured with each of their axes along a common axis for said body, and including the step of securing to the body an end portion having a central shaft along the common axis of said sections for rotation of said body thereabout.

16. The method of claim 13 in which the cylindrical sections are formed with peripheries having depressed and raised areas, and includes the step of selectively coating the depressed and raised areas of said sections for providing said encoded binary information.

17. The method of claim 16 in which the cylindrical sections are made of a light transmitting material and are formed with a central opening to provide a cylinder wall, and the depressed areas of the peripheries of the sections are coated to prevent wall transmission of light therethrough while allowing light transmission through the raised areas of the walls for providing said encoded binary information.

18. The method of claim 17 in which the entire peripheries of the sections of the body are coated to prevent transmission of light therethrough, and the coating is removed from the raised areas leaving the coating on the depressed areas.

19. The method of claim 18 in which the coating is applied to the entire peripheries of the sections of the body by a roller printing process.

20. The method of claim 16 in which the cylindrical sections are made of a light transmitting material and are formed with a central opening to provide a cylinder wall, and the raised areas of the sections are coated to prevent wall transmission of light therethrough while allowing light transmission through the depressed areas of the walls for providing said encoding binary information.

21. The method of claim 20 in which the coating is applied to the raised areas only of the sections by a roller printing process.

22. The method of claim 16 including the step of selectively coating the peripheries of the sections with a light reflecting surface for providing said encoded binary information.

23. The method of claim 22 in which the depressed areas of the sections have the light reflecting surface while the raised areas have a non-reflecting surface for providing said encoded binary information.

24. The method of claim 22 in which the raised areas of the sections have the light reflecting surface while the depressed areas have a non-reflecting surface for providing said encoded binary information.

25. The method of claim 23 or 24 in which the cylindrical sections are made of a material which provides non-reflecting surface areas.

26. The method of claim 13 in which the cylindrical sections are formed with peripheries having depressed and raised areas, and includes the step of coating the entire peripheries of the sections of the body with a light reflecting coating for providing said encoded binary information.

27. The method of claim 26 in which the sections of said body are made of a non-reflective material, and includes the step of removing the light reflecting coating from the selected areas of the sections for providing said encoded binary information.

28. The method of claim 27 in which the light reflecting coating is removed from the depressed areas of the sections.

29. The method of claim 27 in which the sections of said body are made of a non-reflective material, and includes the step of removing the light reflecting coating from the raised areas of the sections for providing said encoded binary information.

30. The method of claim 29 in which the light reflecting coating is removed by grinding the raised areas of the sections.

31. The method of claim 26 which includes the step of applying a non-reflecting coating over the light reflecting coating and removing the non-reflecting coating from selected areas of the sections for providing said encoded binary information.

32. The method of claim 31 in which the non-reflecting coating is removed from the raised areas of the sections.

33. The method of claim 32 in which the non-reflecting coating is removed by wiping the raised areas before the non-reflecting coating is dry.

34. The method of claim 22, 27 or 31 in which the light reflecting surfaces are vacuum plated to provide the areas with mirror surfaces.

* * * * *